(12) United States Patent
Nerone

(10) Patent No.: US 8,461,774 B2
(45) Date of Patent: Jun. 11, 2013

(54) LIGHTING POWER CIRCUIT WITH PEAK CURRENT LIMITER FOR EMI FILTER

(75) Inventor: Louis Robert Nerone, Brecksville, OH (US)

(73) Assignee: General Electric Company, Schenectady, NY (US)

( * ) Notice: Subject to any disclaimer, the term of this patent is extended or adjusted under 35 U.S.C. 154(b) by 331 days.

(21) Appl. No.: 13/047,914

(22) Filed: Mar. 15, 2011

(65) Prior Publication Data
US 2012/0235597 A1 Sep. 20, 2012

(51) Int. Cl.
*H05B 37/02* (2006.01)
(52) U.S. Cl.
USPC .............................. 315/291; 315/297; 315/307
(58) Field of Classification Search
USPC .................. 315/200 R, 209 R, 224–226, 244, 315/291, 297, 307
See application file for complete search history.

(56) References Cited

U.S. PATENT DOCUMENTS

| | | | |
|---|---|---|---|
| 6,373,200 B1 | 4/2002 | Nerone et al. | |
| 8,183,787 B2 * | 5/2012 | Ren et al. | 315/209 R |
| 2005/0012472 A1 * | 1/2005 | Soehnel | 315/291 |
| 2009/0108765 A1 | 4/2009 | Weightman et al. | |
| 2009/0322237 A1 | 12/2009 | Bobel | |

OTHER PUBLICATIONS

"Transition-mode PFC controller", L6562, from STmicroelectronics, Nov. 2005, pp. 1-16.
Tjokrorahardjo, A.; "Simple Triac Dimmable Compact Fluorescent Lamp Ballast and Light Emitting Diode Driver", Applied Power Electronics Conference and Exposition (APEC), 2010 Twenty-Fifth Annual IEEE, Piscataway, NJ, Feb. 21, 2010, pp. 1352-1357.
PCT Search Report and Written Opinion dated May 31, 2012 from corresponding Application No. PCT/US2012/026514.

* cited by examiner

*Primary Examiner* — Jimmy Vu
(74) *Attorney, Agent, or Firm* — Fay Sharpe LLP

(57) ABSTRACT

Light source power circuits and EMI filters therefor are presented in which a depletion mode field effect transistor is connected in series with an EMI filter capacitor following an input rectifier to allow filtering of EMI and to limit capacitive currents during triac switching when powered through a phase-cutting dimmer circuit.

14 Claims, 3 Drawing Sheets

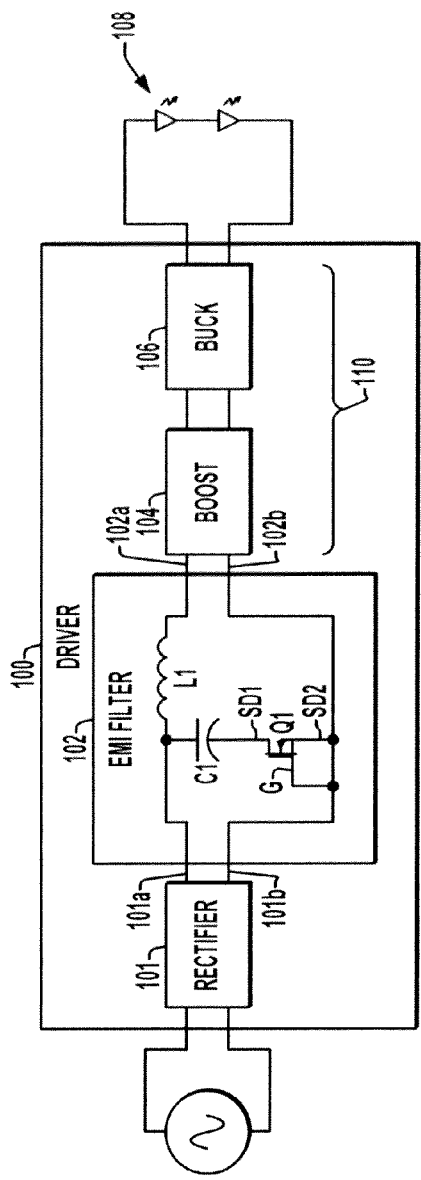
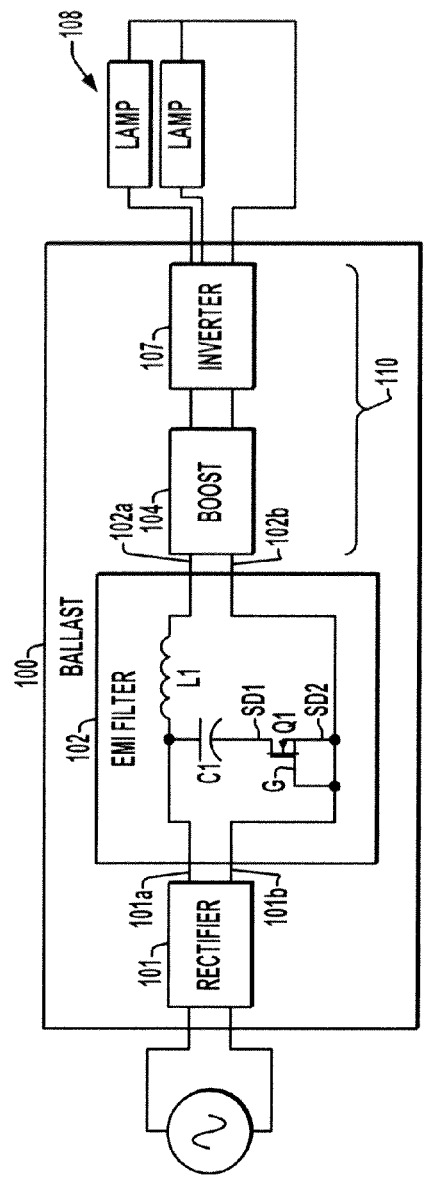

US 8,461,774 B2

LIGHTING POWER CIRCUIT WITH PEAK CURRENT LIMITER FOR EMI FILTER

BACKGROUND OF THE DISCLOSURE

Conventional electronic power circuits for lighting systems often employ filter circuits with an inductor in a positive DC branch and a capacitor connected across the DC output terminals of an input rectifier to operate as a low pass filter. This filter circuit inhibits the high frequency electromagnetic interference (EMI) caused by power conversion switching from reaching the power line. These devices may be used conjunction with triac-equipped wall or table-top dimmer circuits connected in line with the electronic ballast or LED driver. Such dimmers provide so-called "phase cut" dimming capability where a portion of the line AC waveform is essentially removed in each AC cycle to reduce the light output.

Integral electronic lamps such as compact fluorescent designs (CFLs) and LED lamps can be used in conventional lamps designed for incandescent bulbs and may include dimming circuitry allowing the light output to be adjusted by phase-cut dimming (triac control). However, the triac operation of such dimmer controls applies a fast step change in the voltage across the EMI filter capacitor, leading to current spikes in the capacitor and in the power line. This can cause degradation of the EMI filter capacitor and can also damage the dimmer triac.

Previous attempts to limit such current spikes have involved connection of a resistance in series with the EMI filter capacitor. In some installations, however, a number of such electronic drivers or ballasts are operated from a common (shared) wall dimmer. In such cases, even with integral current limiting resistors, the peak currents generated by the individual lighting devices can be as high as 3-8 A in some cases, and these are additive at the dimmer, thus potentially leading to triac damage or degradation. Thus, a need remains for improved EMI filter circuits for lighting systems which provides the required filtering in non-dimming applications, and which can be operated in circuits having phase-cutting dimmers without damaging or degrading the dimmer triac.

SUMMARY OF THE DISCLOSURE

The present disclosure provides lighting system power circuitry in which an input rectifier provides rectified DC power via DC output terminals to an EMI filter circuit. In certain embodiments, the circuit forms an LED driver circuit where the power converter circuit is operative to provide a DC output to drive at least one LED light source. In other embodiments, an electronic ballast is provided, in which the power converter circuit includes an inverter that receives a DC output from the DC to DC converter and provides an AC output to power a fluorescent lamp. The filter has output terminals connected to a power converter circuit with at least one DC to DC converter which directly or indirectly provides power to one or more light sources. The EMI filter circuit comprises a filter capacitance with a first terminal coupled with a first rectifier DC output terminal, as well as a field effect transistor (FET) and an inductance. The inductance is coupled between the first rectifier DC output terminal and a first filter output terminal. The transistor comprises a control gate and two source/drain terminals, with the first source/drain terminal coupled with a second terminal of the filter capacitance. The gate terminal and the second source/drain are coupled with the second rectifier DC output terminal.

In certain embodiments, the field effect transistor is a depletion mode device, with the control gate and the second source/drain connected together at the second DC output terminal of the rectifier. An N-channel field effect transistor is used in certain embodiments, with the filter capacitor terminal coupled with a positive rectifier DC output terminal and with the second source/drain terminal and the gate terminal coupled with a negative rectifier terminal. Other embodiments provide a P-channel depletion mode transistor, in which the capacitor terminal is coupled with a negative rectifier output, with the second source/drain and the gate coupled with the positive rectifier output.

In certain embodiments, an enhancement mode field effect transistor is provided, with a bias circuit coupled to the field effect transistor to provide a bias voltage to the gate terminal. In some embodiments, an N-channel device is used with the first capacitor terminal coupled with the positive rectifier output, where the second transistor source/drain is coupled directly or indirectly with the negative DC rectifier terminal. The bias circuit in some embodiments includes a first resistor coupled between the transistor gate and a positive supply voltage, along with a second resistor coupled between the gate and the negative rectifier output. In certain embodiments, a third resistor is coupled between the second source/drain and the negative rectifier DC output terminal.

BRIEF DESCRIPTION OF THE DRAWINGS

One or more exemplary embodiments are set forth in the following detailed description and the drawings, in which:

FIG. 1 is a schematic diagram illustrating an exemplary LED driver with an EMI filter stage having an N-channel depletion mode FET coupled in series with a filter capacitor in accordance with one or more aspects of the present disclosure;

FIG. 2 is a schematic diagram illustrating an exemplary electronic ballast for powering one or more fluorescent lamps, including an N-channel depletion mode FET coupled in series with an EMI filter capacitor

DETAILED DESCRIPTION OF THE PREFERRED EMBODIMENTS

Figure 3:
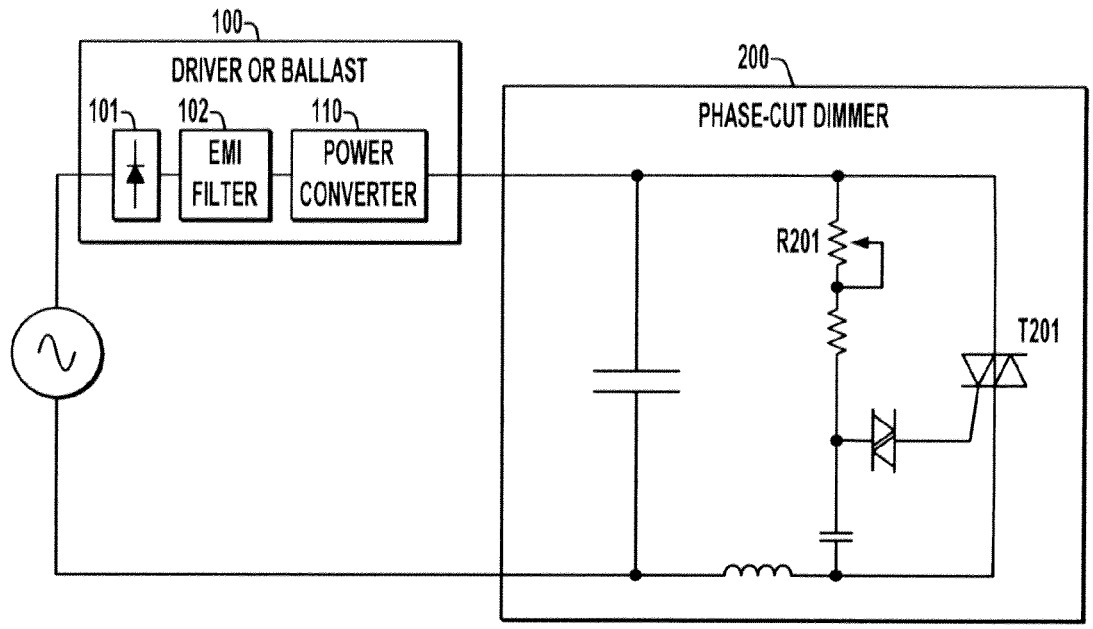
FIG. 3 is a schematic diagram illustrating connection of the driver or ballast of FIG. 1 or 2 with a phase-cut dimmer for dimming operation.

Referring now to the drawings, like reference numerals are used to refer to like elements throughout and the various features are not necessarily drawn to scale. FIGS. 1 and 2 illustrate two exemplary electronic circuits 100 for powering lighting devices. These power circuits 100 each include an input rectifier 101 receiving signal or multi-phase AC input power from an external source, as well as an EMI filter 102 coupled to the DC side of the rectifier 101. The rectifier circuit 101 in certain embodiments is a full wave rectifier type, including four diode rectifiers formed into abridge circuit for single-phase inputs, or 6 or more rectifiers for multi-phase inputs. In other embodiments, the rectifier circuit 101 can be a half-wave rectifier or a single diode.

The circuits 100 of FIGS. 1 and 2 also include a power converter circuit 110 including one or more DC to DC converters for directly or indirectly powering at least one light source 108. In the example of FIG. 1, the circuit 100 is an LED driver with the power converter 110 including a boost-type DC-DC converter stage 104 followed by a buck DC-DC converter 106 that provides a DC output to drive one or more LED lighting devices 108. Other forms of DC-DC converter may be used for the second circuit 106, such as a flyback converter with an isolation transformer, a buck-boost converter, etc. In other possible LED driver configurations, the boost converter 1004 provides DC to an inverter (not shown), which in turn drives an isolation transformer primary whose secondary winding drives an output rectifier connected to an LED array. The circuit 100 of FIG. 2 forms an electronic ballast, and includes an inverter 107 receiving a DC output from the boost converter 104 and providing an AC output to power one or more fluorescent lamps 108. In certain embodiments, one of the DC-DC converter stages may be omitted, and in some embodiments, the initial DC-DC converter stage 104 operates to provide power factor correction functions. Moreover, one or more of the converter stages 104, 106, 107 may provide for dimming control to modify the output power applied to the light source(s) 108 based on a dimming input (not shown).

In addition, as mentioned above and as seen in FIG. 3, the driver or ballast 100 may be powered from a single-phase AC source with dimming control via a phase-cut dimmer 200 coupled in series with the AC source and the driver 100. The dimmer control 200 includes a triac T201 that selectively cuts or interrupts current flow in portions of each cycle of the AC source 101 (phase cutting) to dim the light output according to a user-adjustable resistance R201. In certain embodiments, the driver or ballast circuit 100 may be housed in a structure having an Edison base with AC input terminals.

As seen in FIGS. 1 and 2, the rectifier circuit 101 has AC input terminals for connection to an external source to receive the AC input power, and provides a rectified DC output at first and second DC output terminals 101a and 101b, respectively. This rectifier output 101a, 101b is coupled to first and second input terminals of the EMI filter circuit 102. The filter circuit 102, in turn, includes output terminals 102a and 102b that are coupled to provide the DC input to the initial (e.g., boost) DC-DC converter 104. The output of the boost converter 104 provides DC power at the input of the buck converter 106, and its output is used to directly drive LED light source(s) 108 (e.g., FIG. 1) or the boost converter output is used to indirectly power one or more fluorescent lamps 108 via an inverter (FIG. 2).

The EMI filter circuit 102 in FIGS. 1 and 2 includes an inductor L1 coupled in the upper (positive) DC branch, as well as a capacitor C1 connected in series with an N-channel depletion mode field effect transistor (FET) Q1 in a circuit branch extending between the upper and lower rectifier output terminals 101a and 101b, respectively. In the embodiments of FIGS. 1 and 2, the filter capacitance C1 has a first terminal coupled with the positive DC rectifier output terminal and a second terminal connected to a first source/drain terminal SD1 of the FET Q1, with the inductor L1 extending between the positive DC rectifier output 101a and the upper filter output terminal 102a. The other source/drain terminal SD2 of Q1 is connected to the negative DC output terminal 101b of the rectifier circuit 101, as is the FET gate terminal G.

In operation, the filter circuit 102 provides EMI filtering in operation with application of fully sinusoidal AC input power to the rectifier 101. In certain exemplary embodiments, the inductor L1 has an inductance of approximately 25 mH, which is large enough so that the EMI current at about 150 KHz is relatively small about 10-20 ma of EMI current), and the EMI filter capacitor is about 15 nF, where the EMI filtering ideally provides low pass filtering of interference frequencies of about 150 KHz or more. In this regard, increasing the capacitance of C1 would advantageously improve the EMI filtering capabilities of the circuit 102. However, in situations where the driver or ballast 100 is connected to the power line through a phase-cutting dimmer 200 (e.g., FIG. 3), a larger capacitance for C1 exacerbates the magnitude of current spikes resulting from the mid-cycle firing of the dimming triac T201, absent provision of countermeasures set forth in the present disclosure.

Figure 4:
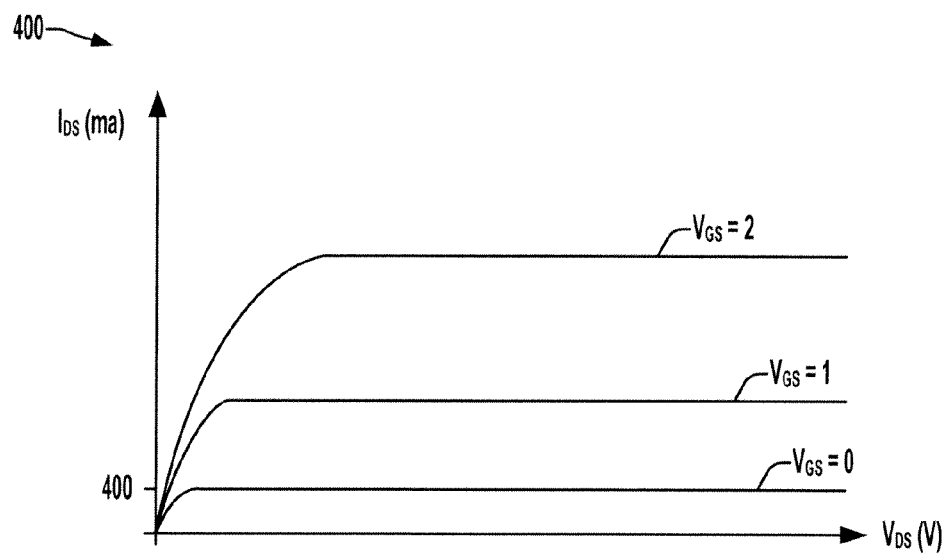
FIG. 4 is a graph illustrating several exemplary drain-source current curves as a function of gate-source voltage for the N-channel depletion mode FET in FIGS. 1 and 2.

Referring also to the graph 400 in FIG. 4, in order to address these current spikes while providing the desired filtering capabilities, the filter circuit 102 in FIGS. 1 and 2 provides an impedance via the FET Q1 in series with the filter capacitor C1. The depletion mode device Q1 is normally on (conductive drain-source channel condition) for non-phase-cutting operation, and the series drain-to-source resistance $RDS_{ON}$ is exemplified in the graph 400 which shows drain-source current curves ($I_{DS}$) as a function of gate-source voltage $V_{GS}$ for Q1. Since the FET in the embodiments of FIGS. 1 and 2 is a depletion mode device, Q1 has a negative threshold voltage $V_T$ and a non-zero current (about 300-400 ma in one example) conducts when the gate and source are shorted together. As seen in FIG. 4, higher $V_{GS}$ values correspond to larger channel current levels $I_{DS}$. Moreover, for a zero $V_{GS}$ value, the impedance of the drain-source channel effectively increases with increased channel voltages $V_{DS}$ levels. In one embodiment, Q1 is chosen to have an $RDS_{ON}$ of about 2-10Ω in the depleted mode at the zero $V_{GS}$ of about ⅓ to ½ of the reactance (1/ωC) of the capacitor, where ω is 150 KHz with respect to the switching frequency of the power converter stage 110. This provides an impedance that will attenuate the potentially damaging current spikes associated with triac firings, while providing the proper filtering with respect to the EMI of the power converter 110. In the illustrated examples of FIGS. 1 and 2, when the triac T201 fires, Q1 will limit the spike current to about 300-400 ma. Thus, even if multiple circuits 100 are connected to a shared or common dimmer 200, the dimmer current is much less than without the EMI filter 102 of the present disclosure (e.g., 3-6 A spike from each ballast, which spike currents are additive at the triac T201).

Thus, when the depletion mode FET Q1 is in EMI filtering mode operation, the circuit 102 filters, and when the triac T201 fires, the FET Q1 comes out of saturation and limits the spike current to a few hundred ma. Thus, the design of FIGS. 1 and 2 is not a fixed resistor in the capacitor circuit, but instead a variable impedance is provided which clamps the maximum current. In one example, an N-channel depletion mode FET Q1 is used, having a 250 volt rating and a rated $RDS_{ON}$ of about 5Ω can be used. It is noted that the use of the variable impedance FET Q1 can facilitate increasing the capacitance of C1 to facilitate improved EMI filtering, with the FET Q1 providing current limiting to mitigate capacitor or triac degradation.

Figure 5:
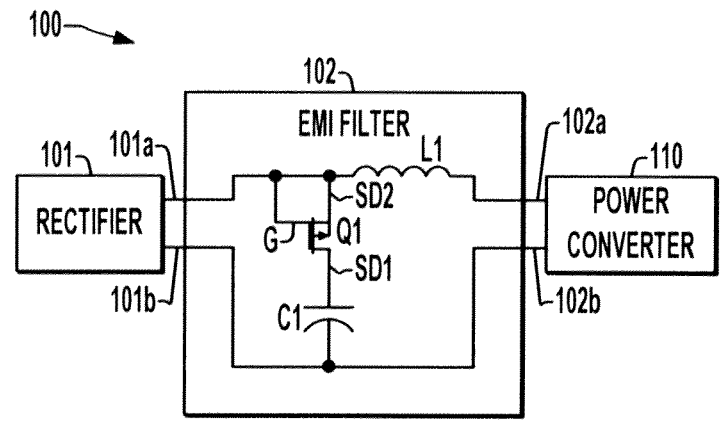
FIG. 5 is a schematic diagram illustrating another exemplary EMI filter circuit that can be used in the power circuits of FIG. 1 or 2, including a P-channel depletion mode FET connected in series with the EMI filter capacitor.

FIG. 5 shows another embodiment of an EMI filter circuit 102 that can be used in driver or ballast type circuits (e.g., FIG. 1 or 2 above). In this case, a P-channel depletion mode FET Q1 is used, with a first source/drain SD1 connected to the upper capacitor terminal of C1, and with the other source/drain SD2 connected to the upper (positive) rectifier DC output terminal 101a. In this implementation, the gate is also connected to the upper DC rail, and the device Q1 provides an on-state resistance $RDS_{ON}$ (e.g., about 2-10Ω) for filtering and current spike protection.

Figure 6:
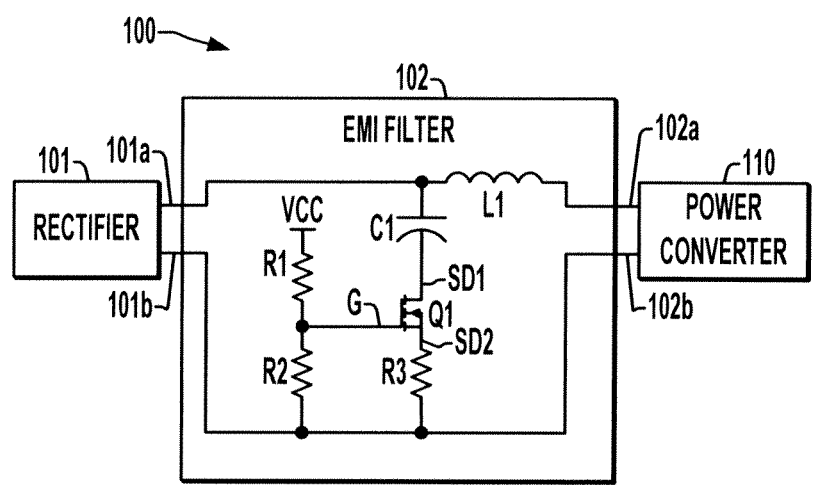
FIG. 6 is a schematic diagram illustrating another EMI filter embodiment, including an N-channel depletion mode FET with a resistive biasing circuit in accordance with the present disclosure.

Referring also to FIG. 6, in other embodiments, an enhancement mode FET Q1 can be used, such as an N-channel device shown in the figure. A bias circuit is provided to set the gate voltage, in this case including a first resistor R1 connected between the gate G and a positive Dc voltage VCC (e.g., 15 volts in one example), with a second resistor R2 connected from the gate G to the lower (negative) DC rectifier output. In one example, the gate voltage is biased by the circuit R1, R2 to about 4 volts for a Q1 threshold voltage $V_T$ of about 3 volts. As with the above embodiments, this connection of an enhancement mode device in series with the capacitor C1 provides an $RDS_{ON}$ (e.g., about 2-10Ω) for filtering and implements current spike protection as the $V_{DS}$ increases. In some embodiments, a third resistor R3 can be provided between the lower source/drain SD1 and the lower DC terminal 101b, such as a 2Ω resistor in one example, so as to allow approximately 500 ma of current flow in the capacitor C1. When the triac T201 is fired, any current spike going beyond this value causes a decrease in the $V_{GS}$, and the device Q1 with reduce the current flow accordingly. In other embodiments, a zener diode can be used in the bias circuit (e.g., a device with a zener voltage $V_Z$ of about 4 v between the FET gate and ground).

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. Although a particular feature of the disclosure may have been illustrated and/or described with respect to only one of several implementations, such feature may be combined with one or more other features of the other implementations as may be desired and advantageous for any given or particular application. Furthermore, references to singular components or items are intended, unless otherwise specified, to encompass two or more such components or items. Also, to the extent that the terms "including", "includes", "having", "has", "with", or variants thereof are used in the detailed description and/or in the claims, such terms are intended to be inclusive in a manner similar to the term "comprising". The invention has been described with reference to the preferred embodiments. Obviously, modifications and alterations will occur to others upon reading and understanding the preceding detailed description. It is intended that the invention be construed as including all such modifications and alterations.

The following is claimed:

1. A circuit for powering at least one light source, comprising:
   a rectifier circuit having AC input terminals to receive AC input power and first and second DC output terminals to provide rectified DC power;
   an EMI filter circuit having first and second filter input terminals coupled with the DC output terminals of the rectifier circuit and first and second filter output terminals, the EMI filter circuit comprising:
      a filter capacitance with a first terminal coupled with the first DC output terminal of the rectifier circuit,
      a field effect transistor, comprising:
         a first source/drain terminal coupled with a second terminal of the filter capacitance,
         a second source/drain terminal coupled with the second DC output terminal of the rectifier circuit, and
         a gate terminal coupled with the second DC output terminal of the rectifier circuit, and
      an inductance with a first terminal coupled with the first DC output terminal of the rectifier circuit, and a second terminal coupled with the first filter output terminal; and
   a power converter circuit, comprising at least one DC to DC converter circuit with DC input terminals coupled with the filter output terminals (102a, 102), the power converter circuit operative to directly or indirectly provide power to at least one light source.

2. The circuit of claim 1, where the power converter circuit is operative to provide a DC output to drive at least one LED light source.

3. The circuit of claim 1, where the power converter circuit comprises an inverter receiving a DC output from the at least one DC to DC converter circuit and providing an AC output to power at least one fluorescent lamp.

4. The circuit of claim 1, where the field effect transistor is a depletion mode field effect transistor.

5. The circuit of claim 4, where the field effect transistor is a depletion mode N-channel field effect transistor, where the first terminal of the filter capacitance is coupled with a positive DC output terminal of the rectifier circuit, and where the second source/drain terminal and the gate terminal are coupled with a negative DC output terminal of the rectifier circuit.

6. The circuit of claim 5, where the power converter circuit is operative to provide a DC output to drive at least one LED light source.

7. The circuit of claim 5, where the power converter circuit comprises an inverter receiving a DC output from the at least one DC to DC converter circuit and providing an AC output to power at least one fluorescent lamp.

8. The circuit of claim 4, where the field effect transistor is a depletion mode P-channel field effect transistor, where the first terminal of the filter capacitance is coupled with a negative DC output terminal of the rectifier circuit, and where the second source/drain terminal and the gate terminal are coupled with a positive DC output terminal of the rectifier circuit.

9. The circuit of claim 1, where the field effect transistor is an enhancement mode field effect transistor.

10. The circuit of claim 9, where the EMI filter circuit comprises a bias circuit coupled to the field effect transistor to provide a bias voltage to the gate terminal.

11. The circuit of claim 10, where the field effect transistor is an N-channel enhancement mode field effect transistor, where the first terminal of the filter capacitance is coupled with a positive DC output terminal of the rectifier circuit, where the second source/drain terminal of the field effect transistor is coupled with a negative DC output terminal of the rectifier circuit, and where the bias circuit comprises:
   a first resistor coupled between the gate terminal of the field effect transistor and a positive supply voltage, and
   a second resistor coupled between the gate terminal of the field effect transistor and the negative DC output terminal of the rectifier circuit.

12. The circuit of claim 11, where the EMI filter circuit comprises a third resistor coupled between the second source/drain terminal of the field effect transistor and the negative DC output terminal of the rectifier circuit.

13. The circuit of claim 9, where the power converter circuit is operative to provide a DC output to drive at least one LED light source.

14. The circuit of claim 9, where the power converter circuit comprises an inverter receiving a DC output from the at least one DC to DC converter circuit and providing an AC output to power at least one fluorescent lamp.

* * * * *